(12) United States Patent
Ahmed et al.

(10) Patent No.: US 7,417,488 B2
(45) Date of Patent: Aug. 26, 2008

(54) REGULATION CIRCUIT FOR INDUCTIVE CHARGE PUMP

(75) Inventors: Muneer Ahmed, Orangevale, CA (US); Johnny Javanifard, Carmichael, CA (US); Peter B. Harrington, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 11/266,218

(22) Filed: Nov. 4, 2005

(65) Prior Publication Data

US 2007/0103994 A1    May 10, 2007

(51) Int. Cl.
*H02J 1/00*    (2006.01)
(52) U.S. Cl. .................. 327/530; 327/538; 327/541
(58) Field of Classification Search ........... None
See application file for complete search history.

(56) References Cited

U.S. PATENT DOCUMENTS

| | | | | |
|---|---|---|---|---|
| 5,382,839 | A | * | 1/1995 | Shinohara .................. 327/545 |
| 6,037,755 | A | * | 3/2000 | Mao et al. .................. 323/222 |
| 6,160,440 | A | | 12/2000 | Javanifard et al. .......... 327/536 |
| 6,469,482 | B1 | | 10/2002 | Javanifard et al. .......... 323/282 |
| 6,664,838 | B1 | * | 12/2003 | Talledo ...................... 327/277 |
| 6,734,655 | B1 | | 5/2004 | Javanifard et al. .......... 323/322 |
| 6,744,669 | B2 | | 6/2004 | Javanifard et al. ...... 365/185.19 |
| 6,777,918 | B2 | | 8/2004 | Harrington et al. .......... 323/222 |
| 7,274,602 | B2 | * | 9/2007 | Arakawa ............... 365/189.09 |

* cited by examiner

*Primary Examiner*—N. Drew Richards
*Assistant Examiner*—An T. Luu
(74) *Attorney, Agent, or Firm*—Ked & Associates, LLP

(57) ABSTRACT

Embodiments of an inductive charge pump are generally described herein. Other embodiments may be described and claimed.

19 Claims, 8 Drawing Sheets

REGULATION CIRCUIT FOR INDUCTIVE CHARGE PUMP

FIELD

Embodiments of the present invention may relate to a boosting circuit that includes an inductive charge pump.

BACKGROUND

Applications may require circuits that can boost up an input power supply direct current (DC) voltage to a higher DC voltage. One reason for the voltage boost up is that often only standardized power supply voltages are available for supplying power to electronic circuits. However, a circuit may need a higher voltage than is available from the associated power supply. One example of such a circuit is a "flash memory" such as an electrical erasable programmable read only memory (EEPROM).

A flash memory may include an array of memory cells each typically storing a plurality of bits of digital information. A memory cell may include a field effect transistor (FET) that includes a gate that holds a charge that corresponds to a bit of digital information (termed herein as a "bit charge"). More specifically, a memory cell FET may include a drain, a gate, and a source. The gate may include a control gate for enabling reading, writing, and erasing operations on the cell, and a floating gate for storing the bit charge of digital information. In addition to these gates, some memory cells may include an erase gate for removing the bit charge from the floating gate, thereby erasing the memory cell.

In a flash memory circuit, a majority of the circuit operations may require a voltage on the order of 1.5 volts, for example. Thus, the design of the power supply for the flash memory circuit may include a 1.5 volt power supply. However, to generate a higher voltage for writing and erasing operations, a DC voltage boost circuit may be used that takes the normal power supply voltage of 1.5 volts and boosts it up to about six (6) volts, for example, to perform these higher voltage operations. Other voltage values may also be provided.

BRIEF DESCRIPTION OF THE DRAWINGS

The foregoing and a better understanding of embodiments of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and embodiments of the present invention are not limited thereto.

The following represents brief descriptions of the drawings in which like reference numerals represent like elements and wherein.

DETAILED DESCRIPTION

Figure 1:
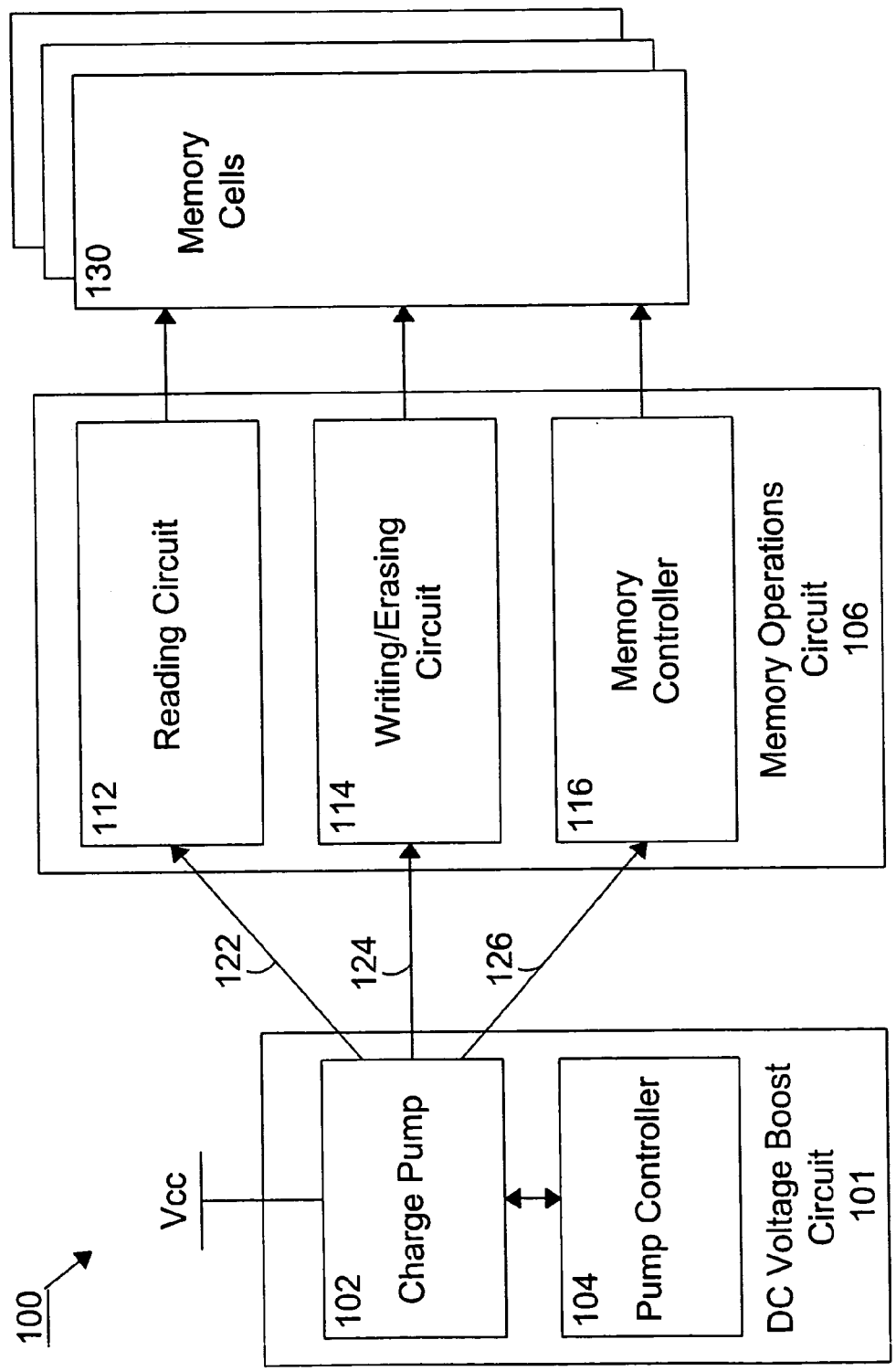
FIG. 1 illustrates a memory circuit according to an example arrangement.

In the following detailed description, like reference numerals and characters may be used to designate identical, corresponding or similar components in differing figure drawings. Further, in the detailed description to follow, example sizes/models/values/ranges may be given although the present invention is not limited to the same. Where specific details are set forth in order to describe example embodiments of the invention, it should be apparent to one skilled in the art that the invention can be practiced without these specific details.

FIG. 1 illustrates a memory circuit according to an example arrangement. Other arrangements are also possible. More specifically, FIG. 1 shows that a memory circuit 100 may include a DC voltage boost circuit 101, a memory operations circuit 106, and one or more memory cells 130. The DC voltage boost circuit 101 may include a charge pump 102 and a pump controller 104. The memory operations circuit 106 may include a reading circuit 112, a writing/erasing circuit 114, and a memory controller 116.

In operation, the charge pump 102 of the DC voltage boost circuit 101 may receive a low power supply voltage (Vcc) and generate higher voltages as needed for performing reading, writing, erasing and memory controller operations. These voltages are coupled to the reading circuit 112, the writing/erasing circuit 114, and the memory controller 116 of the memory operations circuit 106 by way of lines 122, 124, and 126, respectively. The pump controller 104 may regulate the voltages provided to the memory operations circuit 106 so that they are maintained at constant desired voltages. The voltage provided to the writing/erasing circuit 114 may be higher than the power supply voltage Vcc (e.g., 1 volt or 1.5 volts) in order to perform the writing and erasing operations. The voltage provided to the writing/erasing circuit 114 may be six (6) volts, for example. On the other hand, the voltages provided for reading and memory controller operations may be much lower, for example, about 1.5 volts.

The DC voltage boost circuit 101 is not limited to flash memory applications. The DC voltage boost circuit 101 may be used in other applications, including static random access memory (SRAM), dynamic random access memory (DRAM), and other memory applications. Additionally, the DC voltage boost circuit 101 is not limited to memory applications, and may also be used in other applications that use an output voltage that is higher than an input voltage, including wireless, portable computing devices such as personal digital assistants (PDAs), lap top computers, appliances, etc.

Figure 2:
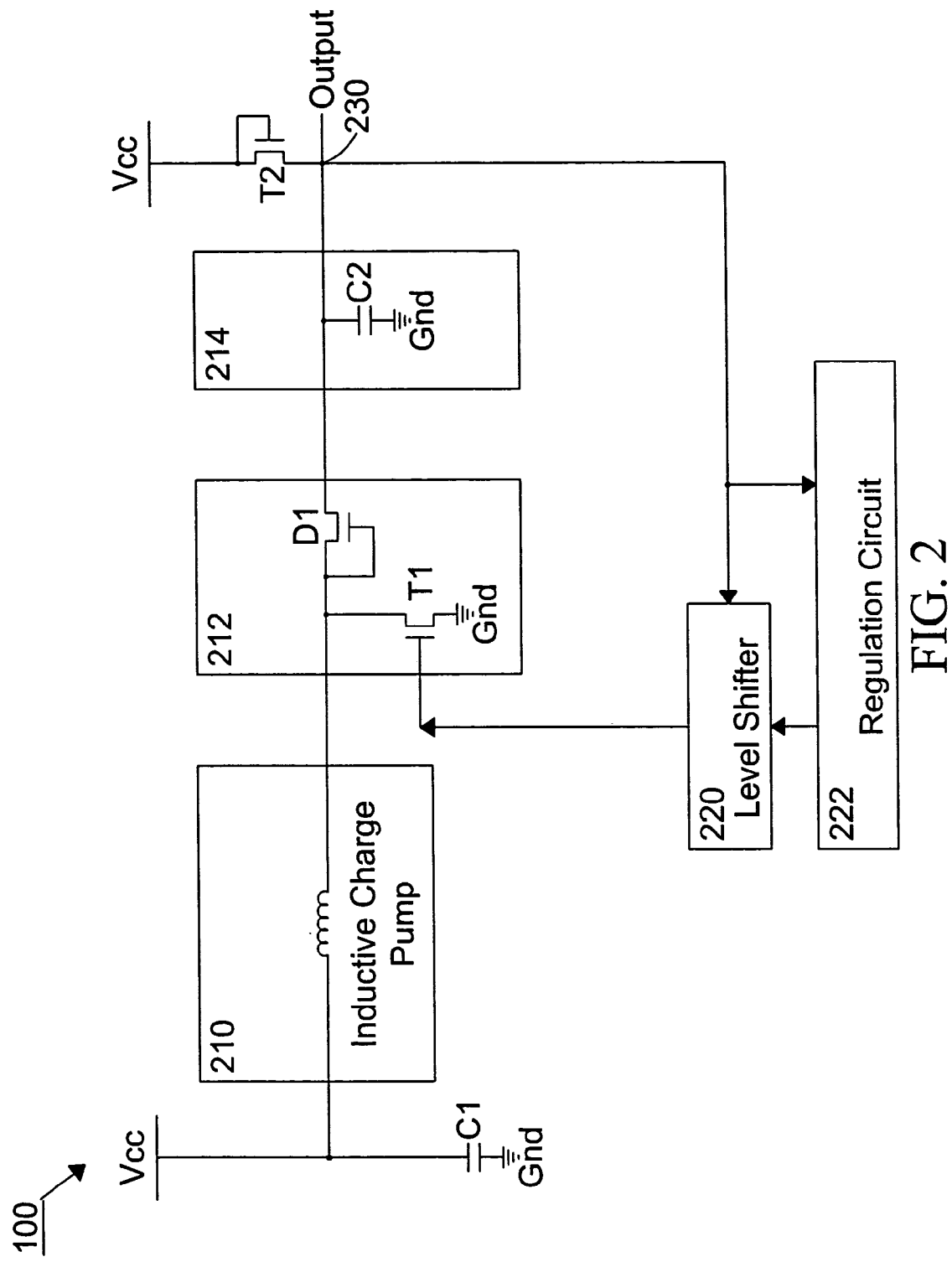
FIG. 2 illustrates a DC voltage boost circuit according to an example arrangement.

FIG. 2 illustrates a DC voltage boost circuit according to an example arrangement. Other arrangements are also possible.

More specifically, FIG. 2 illustrates a DC voltage boost circuit 200 that includes an inductor or inductive element such as an inductive charge pump 210, a charge pump actuating circuit 212, an output charging capacitor 214, a regulation circuit 222 and a level shifter 220. The level shifter 220 may be part of the regulation circuit 222 or may be a separate element. The DC voltage boost circuit 200 may correspond to the DC voltage boost circuit 101 shown in FIG. 1. The charge pump actuating circuit 212 may include a switching element T1 (such as a switching FET T1) and a diode D1. The DC voltage boost circuit 200 may also include a capacitor C1 provided between the power supply voltage Vcc and ground for filtering out noise, spurs and other unwanted signals in the power supply voltage Vcc, and a FET T2 provided between the power supply voltage Vcc and an output node 230 of the DC voltage boost circuit 200 to insure that the output (labeled Output) is at a voltage to energize the level shifter 220 upon start-up. The voltage at the output node 230 may be greater than the Vcc voltage.

In operation, a control signal may be applied to the gate of the switching transistor T1 which causes the switching transistor T1 to periodically turn ON and turn OFF. The turning ON of the transistor T1 causes a current to flow from the power supply voltage Vcc through the inductive charge pump 210 and down to ground through the switching transistor T1. The inductive charge pump 210 stores energy formed by the current flowing through the inductor of the inductive charge pump 210. When the oscillating control signal causes the transistor T1 to turn OFF, the voltage at the drain of the transistor T1 spikes up, which is transferred to the output charging capacitor C2 by way of the diode D1. The transfer of the voltage to the output charging capacitor C2 increases the output voltage of the DC voltage boost circuit 200 at the output node 230 (shown as Output).

Thus, each cycle of the control signal results in an additional packet of charges to transfer to the output charging capacitor C2. The diode D1 may prevent those charges from flowing backwards through the switching transistor T1 during the next ON cycle of the switching transistor T1. By cycling the control signal, a build up of charges results on the output charging capacitor C2 until a steady-state voltage results at the output node 230 of the DC voltage boost circuit 200. The steady-state voltage may depend on characteristics of the control signal, including its frequency and duty cycle.

The output of the DC voltage boost circuit 200 may be applied to the regulation circuit 222. The regulation circuit 222 may develop the control signal used to drive the switching transistor T1 so that a constant voltage is maintained at the output node 230 of the DC voltage boost circuit 200. The regulation circuit 222 may perform this operation in several ways.

Arrangements and embodiments of the present invention may utilize a pulse width modulated control signal as will be explained below. The pulse width modulated control signal voltage may drive the transistor T1 into its ON and OFF states. By increasing the drive to the transistor T1 using the level shifter 220, the transistor T1 may use less die teal estate.

For a pulse width modulated control signal, if the output voltage of the boost circuit 200 falls below a desired level, then the regulation circuit 222 senses this decrease. In response to sensing a decrease in the output voltage, the regulation circuit 222 may increase a duty cycle of the modulated control signal to increase the packet size of charges delivered to the output capacitor C2. This action may increase the voltage at the output node 230 of the DC voltage boost circuit 200 to compensate for the drop in the output voltage.

If, on the other hand, the output voltage of the DC voltage boost circuit 200 rises above a desired level, then the regulation circuit 222 may sense this increase, and responsively decrease the duty cycle of the modulated control signal in order to decrease the packet size of charges delivered to the output charging capacitor C2. This action may decrease the voltage at the output node 230 of the DC voltage boost circuit 200 in order to compensate for the initial rise in the output voltage.

Embodiments of the present invention may relate to a regulation circuit for a DC voltage boost circuit. The regulation circuit may include devices/circuits to provide a duty cycled control signal to a pull-down transistor such as the transistor T1 of the DC voltage boost circuit. A duty cycle to be applied to the transistor T1 may be selected from several duty cycle signals. The regulation circuit may include a resistor ladder coupled to an output node of the DC voltage boost circuit and a plurality of comparators to receive different voltages from the resistor ladder. The comparators may also receive a reference voltage from a bandgap circuit. The comparators may trip and a duty cycle signal (generated by a clock generator circuit) may be selected by a multiplexer. The selected duty cycle signal may be level shifted and input to a gate of the switching transistor T1 (i.e., a pull-down transistor). The applied duty cycle signal may therefore be based on an average current through the inductor.

The inductor (of the inductor charge pump) may store magnetic energy when the switching transistor T1 is ON. When the switching transistor T1 is turned OFF, a voltage at a drain of the switching transistor T1 may rise since current can not change across the inductor instantly. The rising voltage may turn ON the diode D1 and transfer charge to the output charging capacitor 214 (i.e., the output charging capacitor). The voltage across the output charging capacitor may build up a switching effect. The output voltage may be fed back by the regulation circuit and adjusted prior to being input to the switching transistor T1. Also, the output voltage may be sampled by the regulation circuit and adjusted prior to being input to the switching transistor T1. Once the output voltage gets closer to a target voltage. (or desired voltage), a smaller duty cycle signal may be used to transfer charge to the output node. The output voltage may be regulated to generate different duty cycle signals to control the switching transistor T1.

Figure 3:
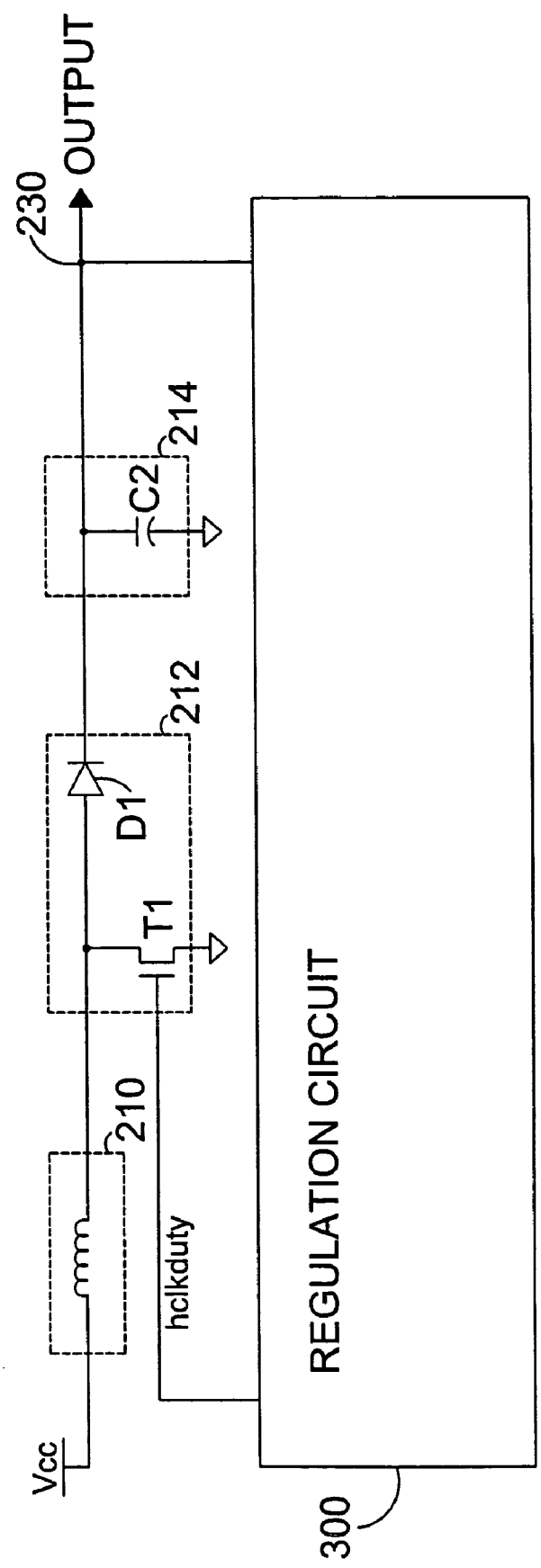
FIG. 3 illustrates a DC voltage boost circuit according to an example embodiment of the present invention.
Figure 4:
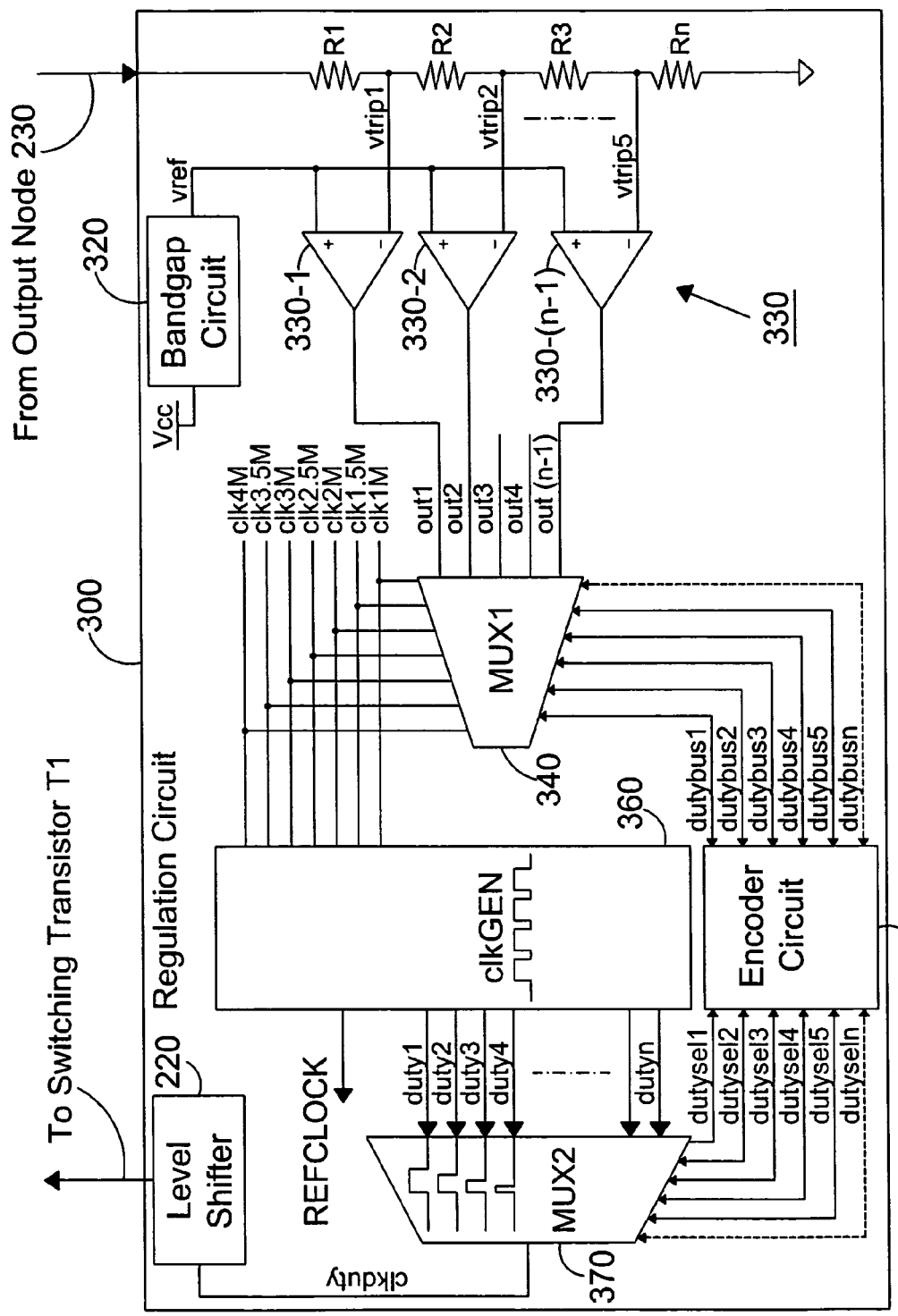
FIG. 4 illustrates a regulation circuit according to an example embodiment of the present invention.

FIG. 3 illustrates a DC voltage boost circuit according to an example embodiment of the present invention. FIG. 4 illustrates a regulation circuit according to an example embodiment of the present invention. Other embodiments and configurations are also within the scope of the present invention. The DC voltage boost circuit shown in FIG. 3 may correspond to the DC voltage boost circuit 101 shown in FIG. 1 and the DC voltage boost circuit 200 shown in FIG. 2. More specifically, FIG. 3 shows the inductive charge pump 210, the charge pump actuating circuit 212, the output charging capacitor 214 and a regulation circuit 300. Although not shown in FIG. 3, the DC voltage boost circuit according to an example embodiment may also include the capacitor C1 and/or the transistor T2 shown in FIG. 2. For ease of illustration, the capacitor C1 and the transistor T2 are not shown in FIG. 3.

The regulation circuit 300 may include a resistor ladder 310, a bandgap circuit 320, a comparator section 330, a multiplexer 340 (labeled MUX1), an encoder circuit 350, a clock generator circuit 360 (labeled CLKGEN) and a multiplexer 370 (labeled MUX2). FIG. 4 shows the level shifter 220 as being internal to the regulation circuit 300, although the level shifter 220 may also be external to the regulation circuit 300. The regulation circuit 300 may provide a control signal (or pulse width modulated control signal) to the switching transistor T1.

The resistor ladder 310 includes resistors R1, R2, R3, ... and Rn, where n is a positive integer, and with each resistor coupled in series. The resistors may be provided between the output node 230 of the DC voltage boost circuit and ground. The resistor ladder 310 therefore provides different voltages based on the output voltage at the output node 230. The bandgap circuit 320 provides a reference voltage (vref) based on the input power supply voltage. Vcc.

The comparator section 330 includes comparators 330-1, 330-2, ... and 330-(n-1). Each of the comparators 330-1, 330-2, ... and 330-(n-1) includes a positive input terminal (+) coupled to receive the reference voltage (vref) from the bandgap circuit 320 and a negative input terminal (-) coupled to one of the nodes on the resistor ladder 310. For example, the negative input terminal of the comparator 330-1 receives a voltage (vtrip1) along a signal line coupled at a node between the resistor R1 and the resistor R2. The negative input terminal of the comparator 330-2 receives a voltage (vtrip2) along a signal line coupled at a node between the resistor R2 and the resistor R3. Additionally, the negative input terminal of the comparator 330-(n-1) receives a voltage (vtrip5) along a signal line coupled at a node between the resistor R5 (not shown) and the resistor Rn.

Each of the comparators 330-1, 330-2, ... and 330-(n-1) performs a comparison of its two respective inputs (i.e., an input to the negative input terminal and an input to the positive input terminal) and provides a corresponding output signal to the multiplexer 340 based on the respective comparisons. For example, the comparator 330-1 may output a signal (out1) to the multiplexer 340, the comparator 330-2 may output a signal (out2) to the multiplexer 340 and the comparator 330-(n-1) may output a signal (out(n-1)) to the multiplexer 340.

Generated clock signals clk1M, clk1.5M, clk2M, clk3M, clk3.5N, and clk4M are provided to both the multiplexer 340 and the clock generator circuit 360. Other clock signals may also be provided. The multiplexer 340 operates as a passing switch. For example, dependent on the selected frequency, each of the comparator outputs may pass through the multiplexer 340 to the encoder circuit 350. For example, the multiplexer 340 may pass signals dutybus1, dutybus2, dutybus3, dutybus4, dutybus5 and dutybusn to the encoder circuit 350. Stated differently, the multiplexer 340 may pass the output signals from the plurality of comparators 330-1, 330-2, ... 330-(n-1) to the encoder circuit 350 based on which frequency is selected based on the clock signals clk1M, clk1.5M, clk2M, clk2.5M, clk3M, clk3.5M and clk4M.

The encoder circuit 350 outputs from a higher duty cycle to a lower duty cycle signal. For example, the encoder circuit 350 outputs select signals dutysel1, dutysel2, dutysel3, dutysel4, dutysel5 and dutyseln in order from higher duty cycle to lower duty cycle. For the selected frequency, there may be five (5) different duty cycle combinations from a higher duty cycle to a lower duty cycle and these are the outputs of the comparators 330-1, 330-2, ..., 330-(n-1). Therefore, all the outputs of the comparators 330-1, 330-2, ..., 330-(n-1) may turn ON in sequence at the output of the encoder circuit 350 to select different duty cycles through the multiplexer 370. The output of the comparators 330 switch depending on the output voltage at the output node 230. Signals pass out of the encoder circuit 350 to select a specific duty cycle for the selected clock signal.

The clock generator circuit 360 may receive the plurality of clock signals clk1M, clk1.5M, clk2M, clk3M, clk3.5M, and clk4M. These clock signals are select signals that enable the clock generator circuit 360 to generate a clock for that frequency and also to generate different combinations (such as 5 combinations) of duty cycles for each frequency of operation. The clock generator circuit 360 can provide or generate different clocks with frequencies such as 1 MHz., 1.5 MHz., 2 MHz., 2.5 MHz., 3 MHz., 3.5 MHz. and 4 MHz. based on the input clock signals. The clock generator circuit 360 may be a voltage controlled oscillator based on current-starved inverters to generate the duty cycles for each selected frequency.

More specifically, the clock generator circuit 360 may generate a plurality of different duty cycle signals from each input clock signal and output the plurality of duty cycle signals. As one example, the clock generator circuit 360 may generate five duty cycles from each input clock signal. Embodiments of the present invention are applicable to other numbers of duty cycles being generated. Each of the generated duty cycle signals may be provided as one of the inputs to the multiplexer 370. More specifically, FIG. 4 shows the duty cycle signals duty1, duty2, duty3, duty4, ..., dutyn output from the clock generator circuit 360 and input to the multiplexer 370. The multiplexer 370 selects (or outputs) one of the input duty cycle signals duty1, duty2, duty3, duty4, ..., dutyn based on the clock select signal input from the encoder circuit 350. The duty cycle signal output from the multiplexer 370 is shown as signal clkduty and corresponds to the control signal to be applied to the transistor T1.

The duty cycle signal (clkduty) output from the multiplexer 370 is input to the level shifter 220. The level shifter 220 drives the gate of the transistor T1 into its ON and OFF states. By increasing the drive to the transistor T1 using the level shifter 220, the transistor T1 may be provided on less die real estate.

Figure 5:
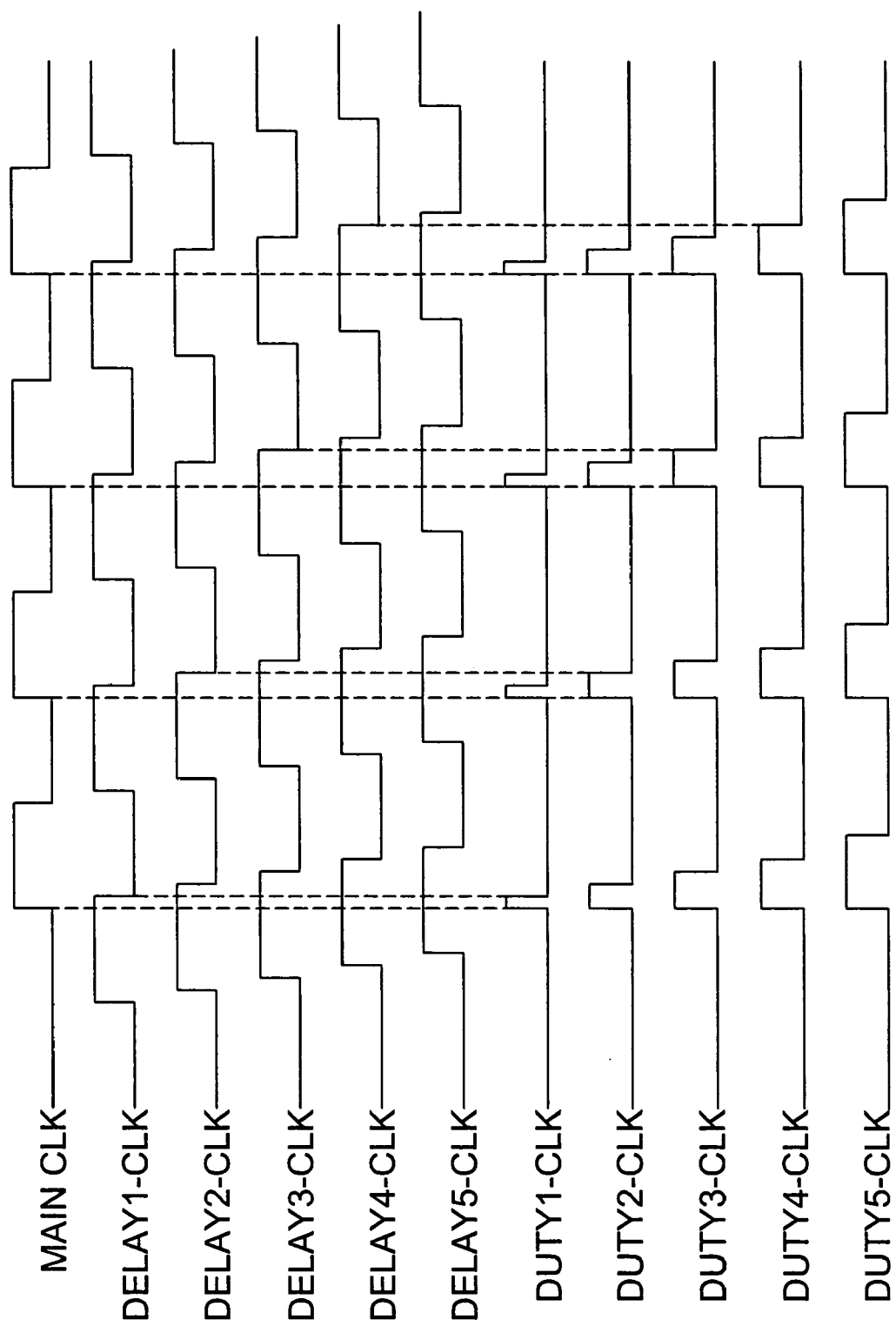
FIG. 5 is a timing diagram showing signals associated with a clock generator circuit according to an example embodiment of the present invention.

FIG. 5 is a timing diagram showing signals associated with a clock generator circuit according to an example embodiment of the present invention. Other embodiments, configurations and timing diagrams are also within the scope of the present invention. More specifically, FIG. 5 shows timing diagrams of a main clock signal, delayed clock signals within the clock generator circuit 360 and duty cycle clock signals output from the clock generator circuit 360. FIG. 5 shows the main clock signal that is generated inside the clock generator circuit 360 that may have a duty cycle. In one embodiment, the duty cycle may be a 50% duty cycle. This 50% duty cycle signal may also be called REFCLOCK. Intermediate signals within a chain of the voltage controlled oscillators forming the clock generator circuit 360 may be either ANDed or ORed with REFCLOCK to generate the various duty cycles.

For each input clock signal, the clock generator circuit 360 may produce five (5) duty cycle signals, for example. That is, the clock generator circuit 360 may provide duty cycle signals DUTY-1CLK, DUTY-2CLK, DUTY-3CLK, DUTY-4CLK and DUTY-5CLK based on the delayed clock signals DELAY1-CLK, DELAY2-CLK, DELAY3-CLK, DELAY4-CLK and DELAY5-CLK and the corresponding input clock, such as the input clock clk1M. All of the duty clock signals may be aligned with a rising edge of the input clock clk1M (shown in FIG. 5 as MAIN CLK) to avoid any jitter. As may be seen, different duty cycle signals may be generated by overlapping the delayed clock signals (of the main clock) within the clock generator circuit 360.

Figure 6B:
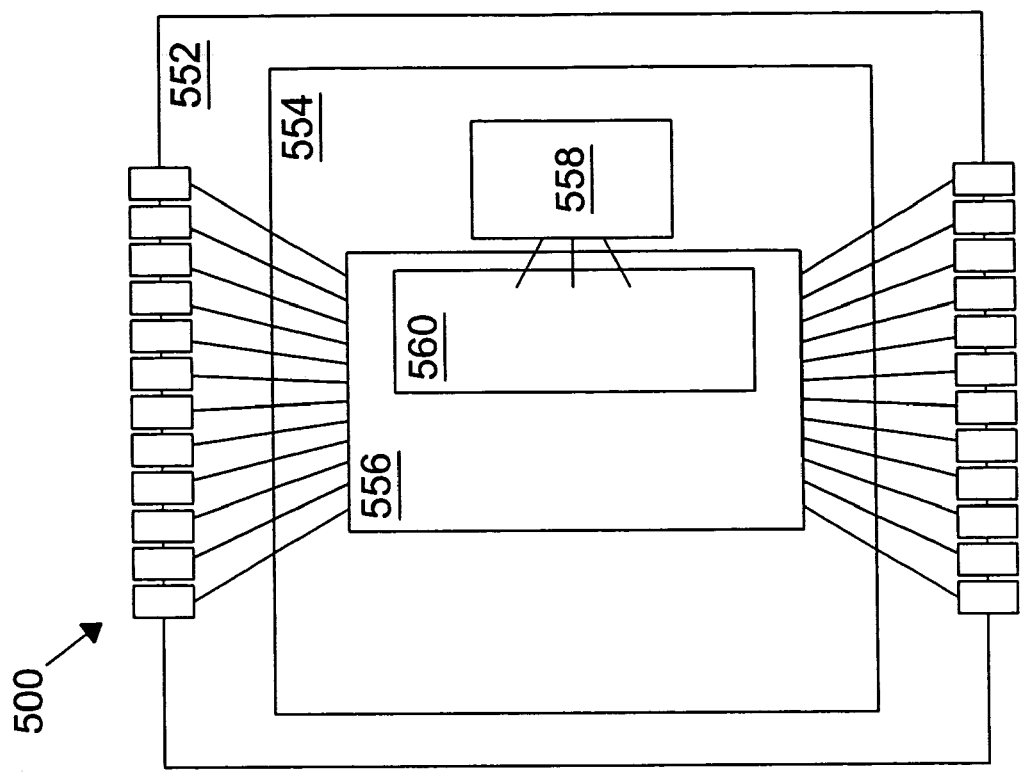
FIG. 6B illustrates an integrated circuit incorporating a DC voltage boost circuit according to an example embodiment of the present invention.
Figure 6A:
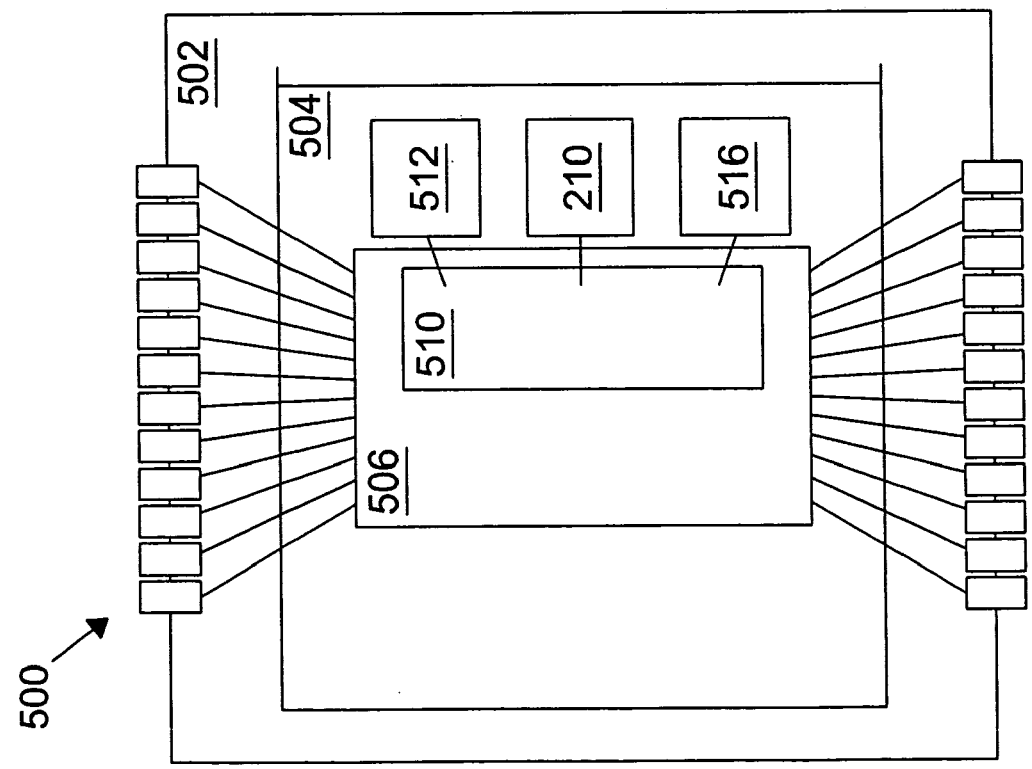
FIG. 6A illustrates an integrated circuit incorporating a DC voltage boost circuit according to an example embodiment of the present invention.

FIG. 6A illustrates an integrated circuit (IC) incorporating a DC voltage boost circuit according to an example embodiment of the present invention. Other embodiments and configurations are also within the scope of the present invention. More specifically, FIG. 6A shows an integrated circuit 500 that includes an integrated circuit package 502 that includes a plurality of leads for connection to external circuitry. The integrated circuit 500 further includes an integrated circuit die 506 provided within a package internal boundary 504 of the integrated circuit package 502. The die 506 may incorporate a portion of a DC boost circuit 510 (such as a portion of the DC boost circuit described above with respect to FIG. 3). For example, the die 506 may incorporate the charge pump actuating circuit 212 (including the switching transistor) and the regulation circuit 300 discussed above. The die 506 may also incorporate a plurality of memory cells. Certain components of the DC boost circuit (such as an input capacitor 512, the inductive charge pump 210 and/or an output capacitor 516) as described above may be provided external to the die 506 and within the package internal boundary 504. These components can be provided next to a side of the die 506 within the package internal boundary 504 as shown in FIG. 6A, or can be provided on top of the die 506 as well. A plurality of wire bonds or other suitable connection means may electrically connect the input capacitor 512, the inductive charge pump 210 and/or the output capacitor 516 of the DC boost circuit 510 to the remaining portions of the booster circuit 510.

FIG. 6B illustrates an integrated circuit incorporating a DC voltage boost circuit according to an example embodiment of the present invention. Other embodiments and configurations are also within the scope of the present invention. More specifically, FIG. 5B shows an integrated circuit 550 that includes an integrated circuit package 552 and an integrated circuit die 556. The integrated circuit die 556 includes a portion of a DC voltage boost circuit 560 situated within an internal boundary 554 of the package 552.

Figure 7:
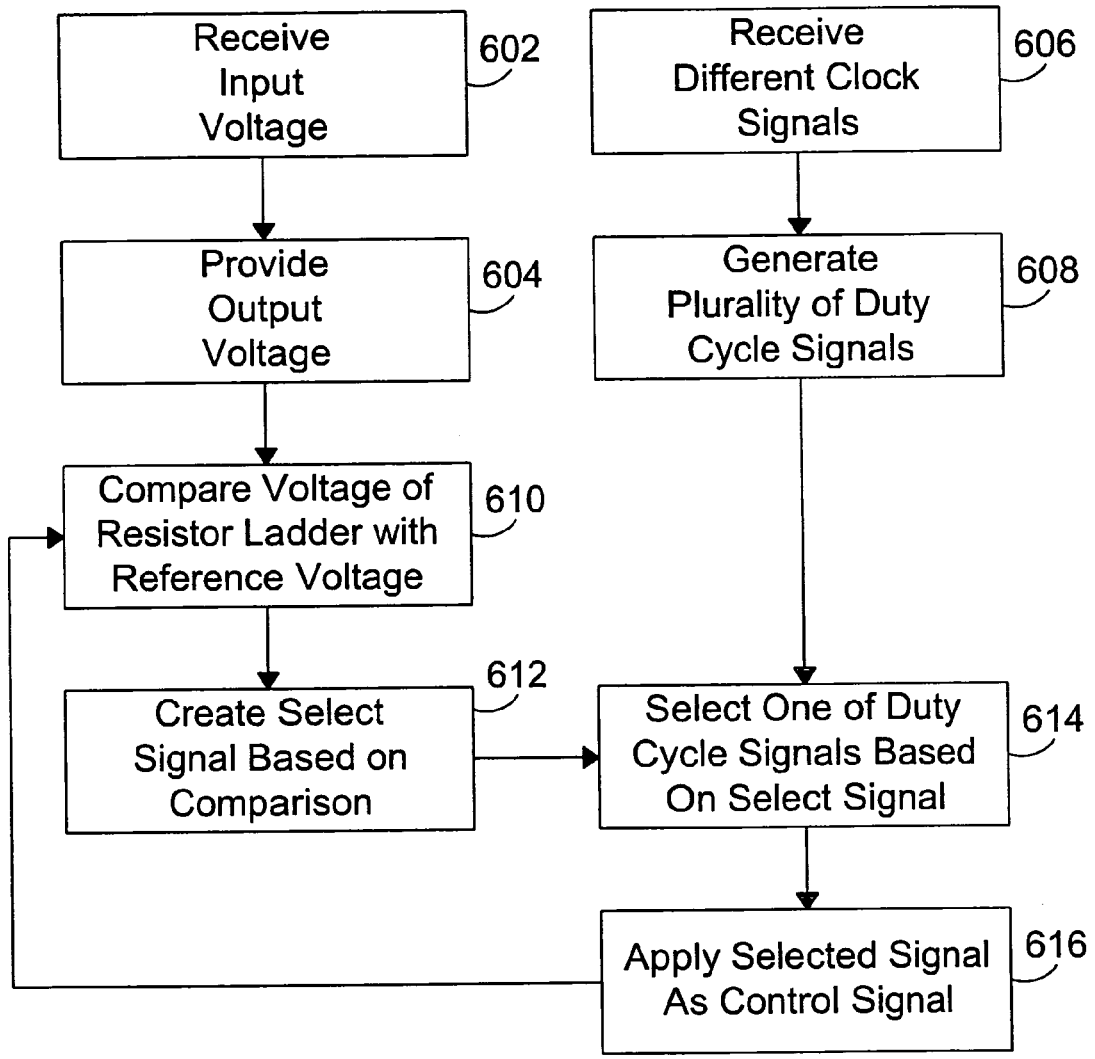
FIG. 7 is a flowchart showing operations according to an example embodiment of the present invention.

FIG. 7 is a flowchart showing operations according to an example embodiment of the present invention. Other operations, orders of operations, flowcharts and embodiments are also within the scope of the present invention. More specifically, FIG. 7 shows that an input voltage may be received in block 602 and an output voltage may be provided in block 604. As discussed above, the output voltage may be an increased voltage such as to apply to a memory array. A plurality of different clock signals (having different frequencies) may be received in block 606. A plurality of duty cycle signals may be generated in block 608 based on the received clock signals.

In block 610, voltages on a resistor ladder coupled to an output node may be compared with a reference voltage (such as from a bandgap circuit). Based on these comparisons, a select signal may be created in block 612. In block 614, one of the duty cycle signals generated in block 608 may be selected based on the select signal created in block 612. The selected duty cycle signal from block 614 may be applied to a switching transistor of a boost circuit in block 616. Operations may continue back to block 610 for further comparisons of voltages of the resistor ladder coupled to the output node of the boost circuit. Further operations of FIG. 7 may occur such that the duty cycle of the control signal applied to the switching transistor may be selected based on the output voltage of the boost circuit.

Figure 8:
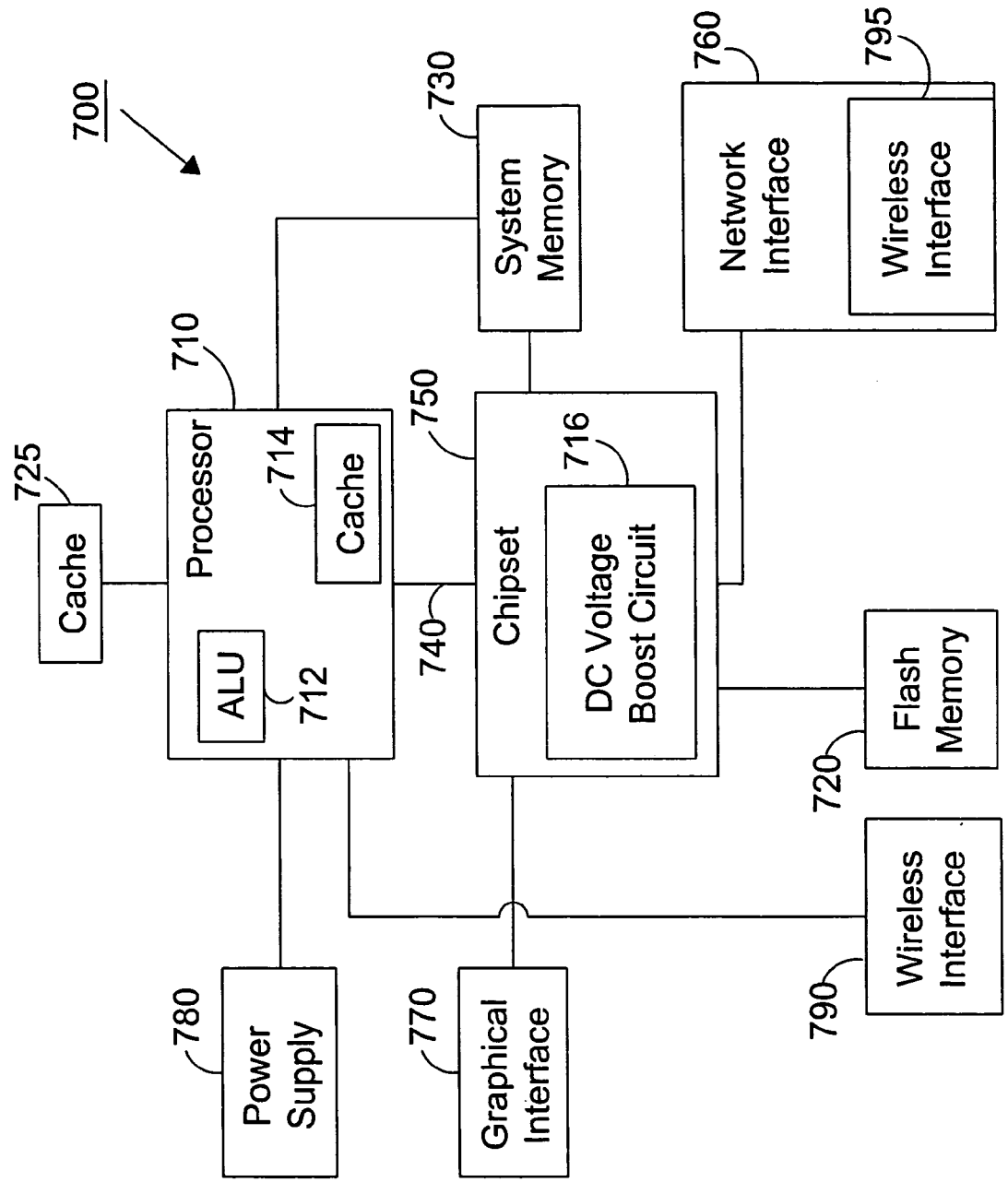
FIG. 8 is a block diagram of a system according to an example embodiment of the present invention.

FIG. 8 is a block diagram of a system (such as a computer system 700) according to an example embodiment of the present invention. Other embodiments and configurations are also within the scope of the present invention. More specifically, the computer system 700 may include a processor 710 that may have many sub-blocks such as an arithmetic logic unit (ALU) 712 and an on-die (or internal) cache 714. The processor 710 may also communicate to other levels of cache, such as external cache 725. Higher memory hierarchy levels such as a system memory (or random access memory (RAM)) 730 may be accessed via a host bus 740 and a chip set 750. The system memory 730 may also be accessed in other ways, such as directly from the processor 710 and without passing through the host bus 740 and/or the chip set 750. The system 700 may further include a non-volatile memory (such as flash memory 720) and a peripheral interface to receive the flash memory 720. A DC voltage boost circuit 716 (such as the DC voltage boost circuit shown in FIG. 3) or portions of a DC voltage boost circuit may be provided in the chipset 750, for example. In addition, other functional units such as a graphical interface 770 and a network interface 760 (such as a network interface controller), to name just a few, may communicate with the processor 710 via appropriate busses or ports. The system may also include a wireless interface 790 and 795 to interface the system 700 with other systems, networks, and/or devices via a wireless connection.

Examples of represented systems may include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), and entertainment devices (e.g., televisions, radios, stereos, tape and compact disc players, video cassette recorders, camcorders, digital cameras, MP3 (Motion Picture Experts Group, Audio Layer 3) players, video games, watches, etc.).

Any reference in this specification to "one embodiment," "an embodiment," "example embodiment," etc., means that a particular feature, structure, or characteristic described in connection with the embodiment is included in one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for each of understanding, certain method operations may have been delineated as separate operations; however, these separately delineated operations should not be construed as necessarily order dependent in their performance. That is, some operations may be able to be performed in an alternative ordering, simultaneously, etc.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A memory circuit comprising:
an inductive element to receive an input voltage;
a switching transistor coupled to the inductive element;
a capacitive element to store energy based on the switching transistor; and
a regulation circuit to select one of a plurality of duty cycle signals and to provide a control signal to the switching transistor based on the selected one of the duty cycle signals, and the inductive element, the switching transistor and the regulation circuit to provide an output voltage at an output node, the regulation circuit including:

a resistor ladder to couple to the output node to provide a plurality of different voltages based on the output voltage at the output node, a bandpass circuit to provide a reference voltage, a plurality of comparators to compare voltages from the resistor ladder with the reference voltage and to provide output signals, a first multiplexer to receive the corresponding output signals from the plurality of comparators and to provide output signals based on the received output signals, a clock generator circuit to generate the plurality of duty cycle signals, and a second multiplexer to select the one of the plurality of the duty cycle signals as the control signal.

2. The memory circuit of claim 1, wherein the regulation circuit further includes:

an encoder circuit to receive the output signals of the first multiplexer and to provide a select signal to the second multiplexer, the select signal to select the one of the duty cycle signals as the control signal.

3. The memory circuit of claim 1, wherein the regulation circuit to further select another one of the plurality of duty cycle signals and to provide the control signal to the switching transistor based on the selected another one of the duty cycle signals.

4. The memory circuit of claim 1, further comprising:

an integrated circuit die incorporating a plurality of memory cells, the switching transistor and the regulation circuit; and an integrated circuit to encase the integrated circuit die and the inductive element and the capacitive element.

5. The memory circuit of claim 4, wherein the inductive element and the capacitive element are provided external to the integrated circuit die.

6. The memory circuit of claim 5, wherein the inductive element and the capacitive element are provided on the integrated circuit die.

7. An apparatus comprising:

an inductive element, a switching transistor and a capacitive element to provide an output at an output node in response to an input voltage and a control signal, the output voltage being greater than the input voltage; and a regulation circuit to provide a plurality of duty cycle signals and to select one of the duty cycle signals as the control signal, the regulation circuit including:

a resistor ladder to couple to the output node to provide a plurality of different voltages based on the output voltage at the output node, a bandpass circuit to provide a reference voltage, a plurality of comparators to compare the voltages from the resistor ladder with the reference voltage and to provide output signals, a first multiplexer to receive the corresponding output signals from the plurality of comparators and to provide output signals based on the received output signals, a clock generator circuit to generate the plurality of duty cycle signals, and a second multiplexer to select the one of the plurality of the duty cycle signals as the control signal.

8. The apparatus of claim 7, wherein the regulation circuit further includes:

an encoder circuit to receive the output signals of the first multiplexer and to provide a select signal to the second multiplexer, the select signal to select the one of the duty cycle signals as the control signal.

9. The apparatus of claim 7, wherein the regulation circuit to further select another one of the plurality of duty cycle signals and to provide the control signal based on the selected another one of the duty cycle signals.

10. A voltage boosting method comprising:

receiving an input voltage;

providing an output voltage based on the received input voltage, the output voltage being greater than the received input voltage;

selecting one of a plurality of generated duty cycles as a control signal to regulate the output voltage, the selecting being performed at a multiplexer based on the output voltage; and applying the control signal to a switching circuit.

11. The method of claim 10, wherein selecting the one of the duty cycles includes selecting an increased duty cycle signal when the output voltage is below a desired value.

12. The method of claim 10, wherein selecting the one of the duty cycles includes selecting a decreased duty cycle signal when the output voltage is greater than a desired value.

13. The method of claim 10, further comprising applying the output voltage to a memory array.

14. The method of claim 10, further comprising:

selecting another one of the plurality of duty cycles for the control signal to regulate the output voltage, the selecting another one of the duty cycles being based on the output voltage.

15. The method of claim 14, wherein the selecting further includes receiving the output signals at an encoder circuit and providing a select signal to the multiplexer to select the one of the generated duty cycles as the control signal.

16. The method of claim 10, wherein the selecting includes:

providing a plurality of different voltages based on the output voltage at the output node;

comparing the different voltages with a reference voltage and providing different output signals based on the comparing; and receiving the output signals of another multiplexer and providing output signals based on the output signals received at the multiplexer.

17. A system comprising:

a flash memory;

a power supply to supply power to the flash memory; and a boost circuit to provide an output voltage to the flash memory based on power from the power supply, the boost circuit including:

an inductive element;

a switching transistor coupled to the inductive element; and a regulation circuit to provide a control signal to the transistor and to regulate an output voltage of the boost circuit, the regulation circuit including:

a resistor ladder to couple to an output node of the boost circuit to provide a plurality of different voltages based on the output voltage at the output node, a bandpass circuit to provide a reference voltage, a plurality of comparators to compare the voltages from the resistor ladder with the reference voltage and to provide output signals, a first multiplexer to receive the corresponding output signals from the plurality of comparators and to provide output signals based on the received output signals, and a clock generator to generate a plurality of duty cycle signals and a second multiplexer to receive the plurality of duty cycle signals and to output one of the duty cycle signals, the output duty cycle signal corresponding to the control signal.

18. The system of claim 17, wherein the regulation circuit further includes:

an encoder circuit to receive the output signals of the first multiplexer and to provide a select signal to the second multiplexer, the select signal to select one of the duty cycle signals as the control signal.

19. The system of claim 17, wherein the regulation circuit to further select another one of the plurality of duty cycle signals and to provide the control signal to the switching transistor based on the selected another one of the duty cycle signals.

\* \* \* \* \*